US009792965B2

(12) United States Patent
Best et al.

(10) Patent No.: US 9,792,965 B2
(45) Date of Patent: Oct. 17, 2017

(54) MEMORY MODULE AND SYSTEM SUPPORTING PARALLEL AND SERIAL ACCESS MODES

(71) Applicant: Rambus Inc., Sunnyvale, CA (US)

(72) Inventors: Scott C. Best, Palo Alto, CA (US); Frederick A. Ware, Los Altos Hills, CA (US); William N. Ng, San Francisco, CA (US)

(73) Assignee: Rambus Inc., Sunnyvale, CA (US)

( * ) Notice: Subject to any disclaimer, the term of this patent is extended or adjusted under 35 U.S.C. 154(b) by 251 days.

(21) Appl. No.: 14/737,147

(22) Filed: Jun. 11, 2015

(65) Prior Publication Data

US 2015/0363107 A1    Dec. 17, 2015

Related U.S. Application Data

(60) Provisional application No. 62/013,312, filed on Jun. 17, 2014.

(51) Int. Cl.
   *G11C 7/10*     (2006.01)
   *G11C 5/04*     (2006.01)

(52) U.S. Cl.
   CPC .............. *G11C 7/1093* (2013.01); *G11C 5/04* (2013.01); *G11C 7/1003* (2013.01); *G11C 7/1066* (2013.01)

(58) Field of Classification Search
   CPC ....... G11C 7/1093; G11C 5/04; G11C 7/1066; G11C 7/1003
   See application file for complete search history.

(56) References Cited

U.S. PATENT DOCUMENTS

| 6,151,239 | A | 11/2000 | Batra |
| 6,970,013 | B1 | 11/2005 | Cory |
| 7,171,528 | B2 * | 1/2007 | Evans ................. G11C 7/1009 365/120 |
| 7,272,675 | B1 | 9/2007 | Paul et al. |
| 7,739,441 | B1 | 6/2010 | Lee et al. |
| 7,793,043 | B2 | 9/2010 | Blakely et al. |
| 8,018,736 | B2 | 9/2011 | Pairault |
| 8,516,185 | B2 | 8/2013 | Lee et al. |
| 8,688,901 | B2 | 4/2014 | Chiu et al. |
| 8,707,009 | B2 | 4/2014 | Shaeffer |
| 2003/0172243 | A1 | 9/2003 | Ripley |

(Continued)

OTHER PUBLICATIONS

CAB4A-DDR4 Register, "32-Bit 1:2 Command/Address/Control Buffer and 1:4 Differential Clock Buffer," Texas Instruments, Oct. 2013. 11 pages.

(Continued)

*Primary Examiner* — Khamdan Alrobaie
(74) *Attorney, Agent, or Firm* — Silicon Edge Law Group LLP; Arthur J. Behiel

(57) ABSTRACT

A memory module can be programmed to deliver relatively wide, low-latency data in a first access mode, or to sacrifice some latency in return for a narrower data width, a narrower command width, or both, in a second access mode. The narrow, higher-latency mode requires fewer connections and traces. A controller can therefore support more modules, and thus increased system capacity. Programmable modules thus allow computer manufacturers to strike a desired balance between memory latency, capacity, and cost.

20 Claims, 10 Drawing Sheets

(56) References Cited

U.S. PATENT DOCUMENTS

| | | | |
|---|---|---|---|
| 2003/0182519 A1 | 9/2003 | Riesenman et al. | |
| 2004/0186956 A1* | 9/2004 | Perego | G06F 13/1684 711/115 |
| 2006/0107186 A1* | 5/2006 | Cowell | G11C 5/00 714/776 |
| 2007/0088995 A1* | 4/2007 | Tsern | G11C 5/02 714/724 |
| 2007/0136537 A1* | 6/2007 | Doblar | G06F 13/1684 711/154 |
| 2008/0256281 A1 | 10/2008 | Fahr et al. | |
| 2010/0103713 A1* | 4/2010 | Kizer | G06F 13/4239 365/51 |
| 2013/0033954 A1* | 2/2013 | Shaeffer | G11C 5/04 365/230.03 |
| 2013/0254495 A1 | 9/2013 | Kim et al. | |
| 2013/0311717 A1* | 11/2013 | Kim | G06F 12/0246 711/104 |

OTHER PUBLICATIONS

Findley et al., "DDR4 Memory Ecosystem," Intel, IDF13, SPCS001, Jul. 17, 2013. 18 pages.

Fujitsu Primergy Servers, "Memory Performance of Xeon e5-2600 v2 (Ivy Bridge—EP) Based Systems," White Paper, Memory Performance of Xeon E5-2600 V2, Nov. 12, 2013. 21 pages.

INPHI Corporation, "Intrdoucing LRDIMM—A New Class of Memory Modules," White Paper, Jul. 21, 2011, Inphi Corporation. 9 pages.

Intel, "Xeon Processor E5-1600/E5-2600/E5-4600 Product Families," DataSheet, vol. 1, May 2012. 258 pages.

Nvdimm, "Non-Volatile Dual In-line Memory Module," Article Sources and Contributors, 2012. 3 pages.

Vogt, Pete, "Fully buffered DIMM (FB-DIMM) Server Memory Architecture: Capacity, Performance, Reliability, and Longevity," Intel Corporation, Feb. 18, 2004. 33 pages.

* cited by examiner

MEMORY MODULE AND SYSTEM SUPPORTING PARALLEL AND SERIAL ACCESS MODES

TECHNICAL FIELD

The subject matter presented herein relates generally to computer memory.

BACKGROUND

Computers include at least one central processing unit (CPU) that follows instructions and manipulates data. These instructions and data are stored in various types of memory. Managing the flow of information between the CPU and the memory requires considerable processing, which would interfere with CPU operation. A memory controller is therefore provided to manage the flow of information between the CPU and the memory. The memory controller can be integrated with the CPU, or can be a separate integrated circuit.

Ideally, a CPU in operation is never starved of instructions or data. If the communication between the CPU and the memory controller is too slow, the CPU can waste valuable time awaiting information. The speed of a memory system has two essential characteristics, latency and bandwidth. "Latency" refers to the delay between a memory request and information delivery, whereas "bandwidth" refers to the amount of information that can be delivered by the memory per unit time.

Processing speed can be heavily dependent upon memory latency. Memory devices and systems have therefore been designed to minimize latency. However, latency is but one variable in system performance, and the cost of achieving low latency can be prohibitive. Processes that make relatively few requests for larger amounts of information can be, for example, more impacted by memory bandwidth than latency. Computer users may tolerate—or even fail to notice—longer latencies where bandwidth or capacity are more significant factors. Computer systems with longer memory latencies would therefore be in demand if the relatively minor loss of performance was accompanied by significant cost savings, countervailing capacity improvements, or both.

BRIEF DESCRIPTION OF THE FIGURES

The figures are illustrations by way of example, and not by way of limitation. Like reference numerals in the figures refer to similar elements.

DETAILED DESCRIPTION

Figure 1:
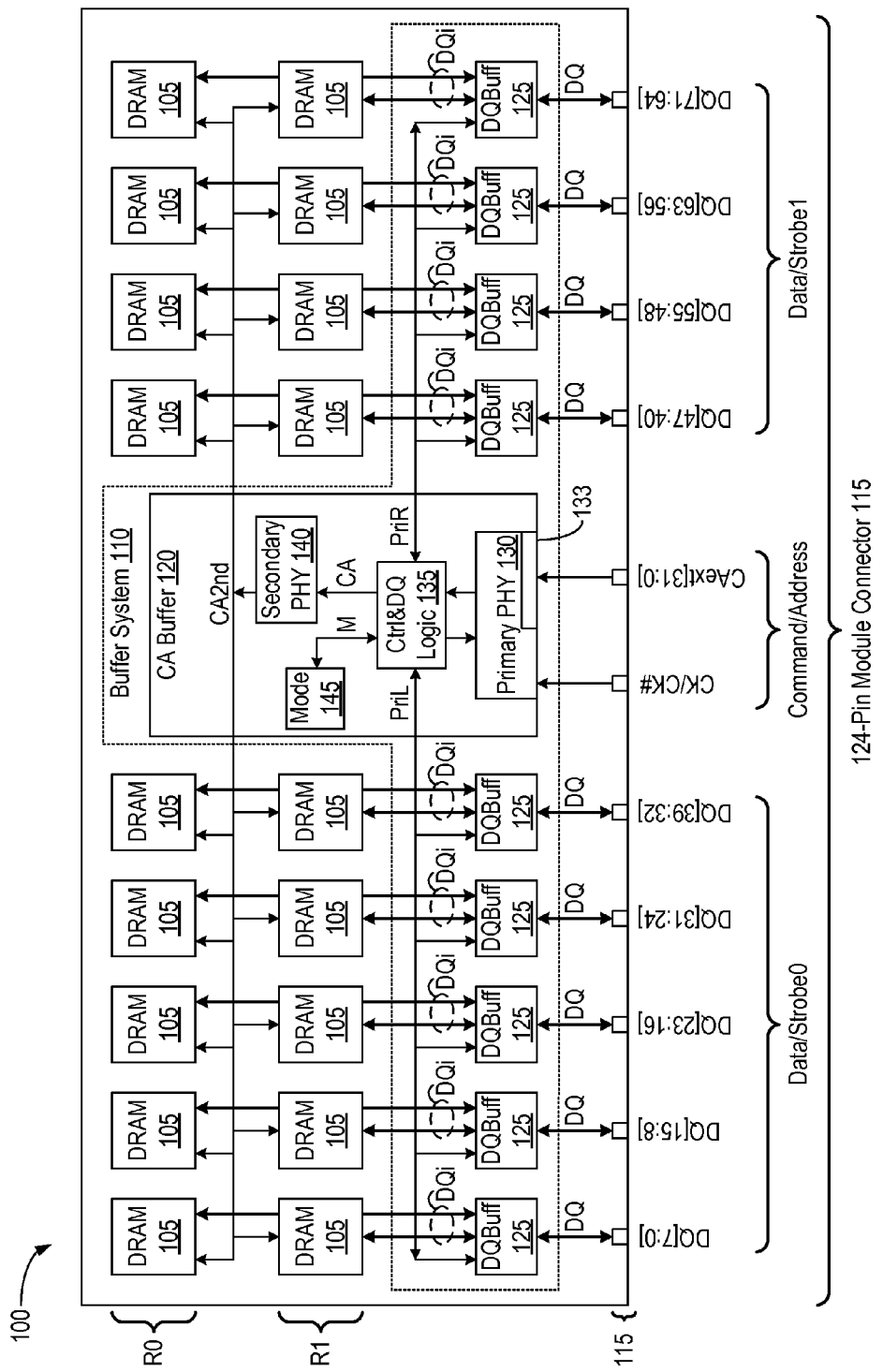
FIG. 1 depicts a memory module 100 that can be programmed to deliver relatively wide, low-latency data in a first access mode, or to sacrifice some latency in return for a narrower data width, a narrower command width, or both, in a second access mode.

FIG. 1 depicts a memory module 100 that can be programmed to deliver relatively wide, low-latency data in a first access mode, or to sacrifice some latency in return for a narrower data width, a narrower command width, or both, in a second access mode. The narrow, higher latency mode requires fewer connections and traces. A single pad-limited controller, illustrated in connection with later figures, can therefore support more modules, and thus increased system capacity. A single type of programmable module thus allows computer manufacturers to strike a desired balance between memory latency, capacity, and cost.

Module 100 includes a number of IC memory devices 105 divided into two ranks R0 and R1. In this example, each rank includes nine 8-bit-wide integrated-circuit (IC) memory devices 105, and each device 105 stores 4 Gbit (512 MByte) of information. One of the nine memory devices 105 in each rank are for error detection and correction (EDC), leaving 8 devices for data. Module 100 thus effectively stores 2×8× 512 MB=8 GB.

Module 100 also includes a buffer system 110 that manages communication between memory devices 105 and a memory controller (not shown) via a module connector 115. Buffer system 110 includes at least one memory-buffer IC, in this example a command/address (CA) buffer 120 (also commonly known as a "CA register" chip) and nine data (DQ) buffers 125. Each DQ buffer 125 is an 8-bit bidirectional data buffer that supports a differential strobe (DQS) signal (not shown). A 8-bit bus connects each buffer 125 to module connector 115, and each of the internal 8-bit DRAM data interfaces DQi connects to one of the x8 DRAM devices 105 in one of ranks R0 and R1. Note that in some embodiments, the DRAM devices are 4-bits wide rather than 8-bit (i.e., each rank on the 72-bit module would consist of eighteen x4 DRAMs instead of nine x8 DRAMs as shown in FIG. 1), and in this embodiment each of the nine DQ buffers 125 would have dual x4 interfaces rather than a single x8 interface. Each buffer 125 additionally supports a configurable interface (FIG. 5) that is connected to CA buffer 120 via either a left private bus PriL or a right private bus PriR. These private busses convey control signals, a voltage reference, and a differential clock signal to buffers 125.

Private busses of this type are sometimes referred to as "BCOM" busses. Also in some embodiments, the PriL and PriR busses are combined into a single "T-shaped" bus which originates at the CA buffer 120 and then splits left and right. In addition, and in support of the narrow mode, CA buffer 120 and DQ buffers 125 can be configured to convey bi-directional data between CA buffer 120 and DQ buffers 125, via this private bus interface.

Module connector 115 includes nine groups of eight parallel DQ input/output (I/O) pins, for a total of 72 DQ signals. (As used herein, the term "data" refers to the information conveyed over these module pins, and is not necessarily descriptive of the type of information so conveyed.) Though not shown, each group of DQ I/O pins is accompanied by a pair of complementary data strobe (DQS/DQS#) signals that convey timing information for the group. Additionally, connector 115 also extends to a CA primary interface 130 on CA buffer 120. Via this interface, the CA buffer receives a true and complement clock pair CK/CK# and command and address signals CAext[31:0]. This CA primary interface 130 includes a configurable command port 133 that can be programmed, depending upon the contents of register 145, to support different signal widths and communication protocols.

CA buffer 120 has the capability of configuring the DQ buffers 125 to provide a width-configurable data port. In a wide mode, each DQ buffer 125 sends and receives data on all eight DQ signal paths. In a narrow mode, each DQ buffer 125 sends and receives relatively narrow serial data, either via a subset of the DQ signal paths or one of private busses PriL and PriR. In the latter case, the external data interface used in the wide mode has an effective data width of zero, with data flowing to and from module 100 via CA buffer 120.

The internal and external data signals DQi and DQ are single-ended and the strobe and clock signals DQS/DQS# and CK/CK# are complementary in this example, but other embodiments will use different types or combinations of types of signaling schemes for the various internal and external connections. In this context, "internal" signal lines are those that communicate wholly within and between devices on module 100, and "external" lines convey signals to and from module 100. All of the data, strobe, command, address, and clock signals in this wide mode can be electrically and logically compatible with known DRAM protocols, which are well understood by those of skill in the art.

CA buffer 120 includes control and data logic 135 to manage the flow of information on module 100, a secondary physical interface 140 that serves as an internal command interface to communicate command and address signals via a secondary command bus CA2nd to DRAM devices 105, and a mode register 145 to store and present a mode signal M to logic 135. CA buffer 120, responsive to a configuration command from the memory controller, loads mode register 145 with a value indicative of either the wide, low-latency mode or the relatively narrower and higher-latency mode.

Figure 2:
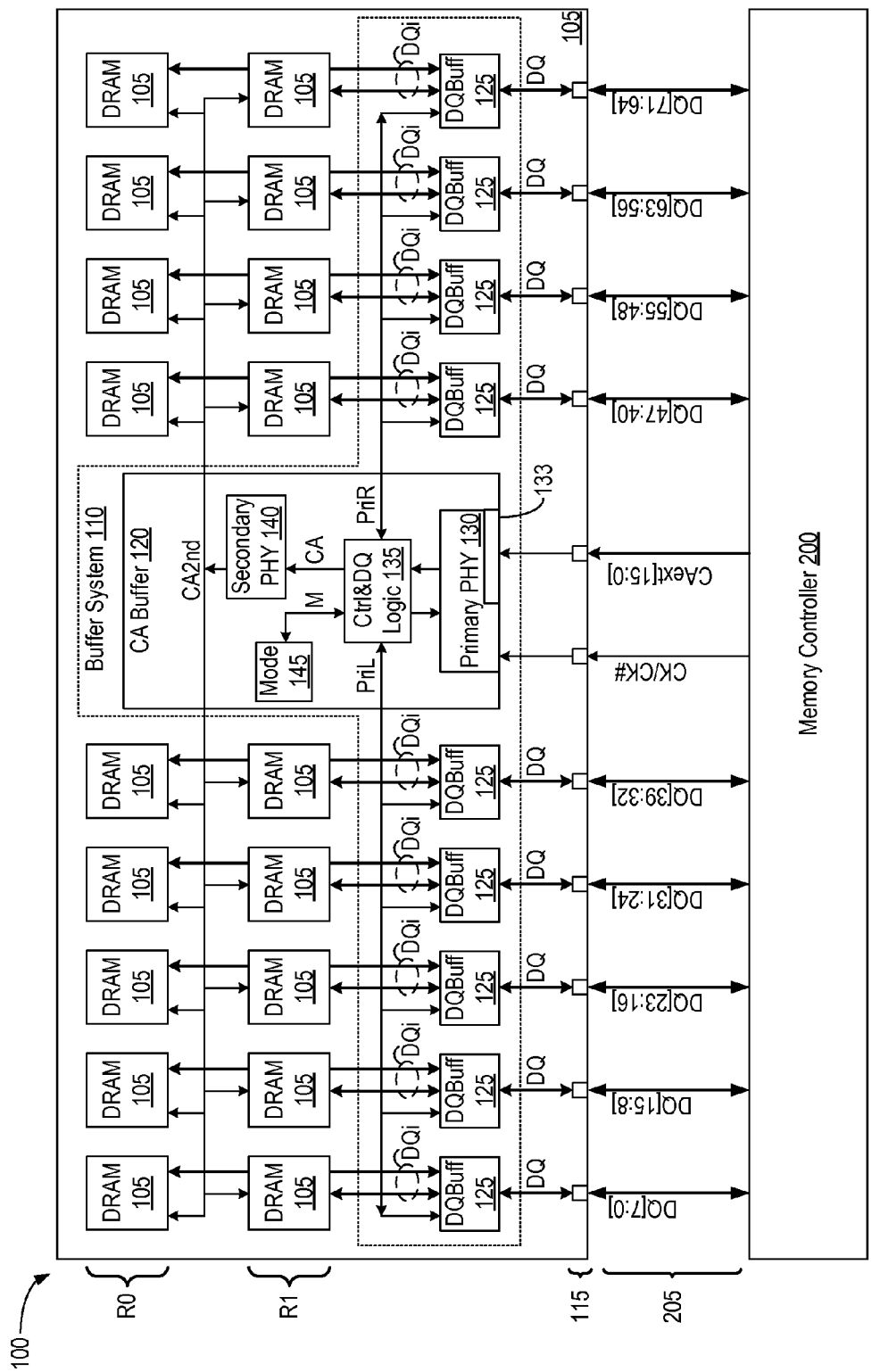
FIG. 2 depicts module 100 of FIG. 1 connected to a memory controller 200 via a memory channel 205.

FIG. 2 depicts module 100 of FIG. 1 connected to a memory controller 200 via a memory channel 205. In this example, module 100 is configured to operate in a first mode, a wide, low-latency, parallel-access mode. Module 100 includes a "DDR4 LRDIMM chipset" in which memory devices 105 interface with buffer system 110 provides complete buffering of command, address, clock, and data signals. DQ buffers 125 are disposed across the bottom of module 100 to minimize stub lengths and concomitant skew between data bits. Memory controller 200 can be part of a central processing unit, or can be a separate integrated circuit.

The operation of module 100 is consistent with that of LRDIMM server components that employ DDR4 memory. Those of skill in the art are familiar with such operation, so a detailed treatment is omitted. Briefly, CA buffer 120 registers and re-drives clock signal CK/CK# and command and address signals from controller 200 to address and control DRAM devices 105, with primary interface 130 providing load isolation for these signals. Address and control signals arrive via configurable command port 133, which in this mode is configured to support a parallel, 32-bit-wide command connection CAext[31:0]. Logic 135 interprets these signals (e.g., in a manner consistent with the DDR4 specification) and conveys them to devices 105 via secondary bus CA2nd.

DQ buffers 125 provide load isolation for read, write, and strobe signals to and from devices 105, and receive control signals via private busses PriL and PriR to e.g. prepare them for the direction of data flow. The private busses also convey mode-selection information that can alter the way buffers 125 convey data. Some such configuration options are detailed below.

Including 72 data signals, true and complement strobes, plus the 32 bits of CA information, memory channel 205 includes about one hundred forty electrical connections on a motherboard (not shown) that supports both controller 200 and module 105. To interface to this memory channel, controller 200 includes about two hundred fifty input/output pins, including those for power and ground. Assuming controller 200 supports four independent memory channels 205, and each channel two modules 100, controller 200 requires about one thousand input/output pins to accommodate eight memory modules.

Figure 3:
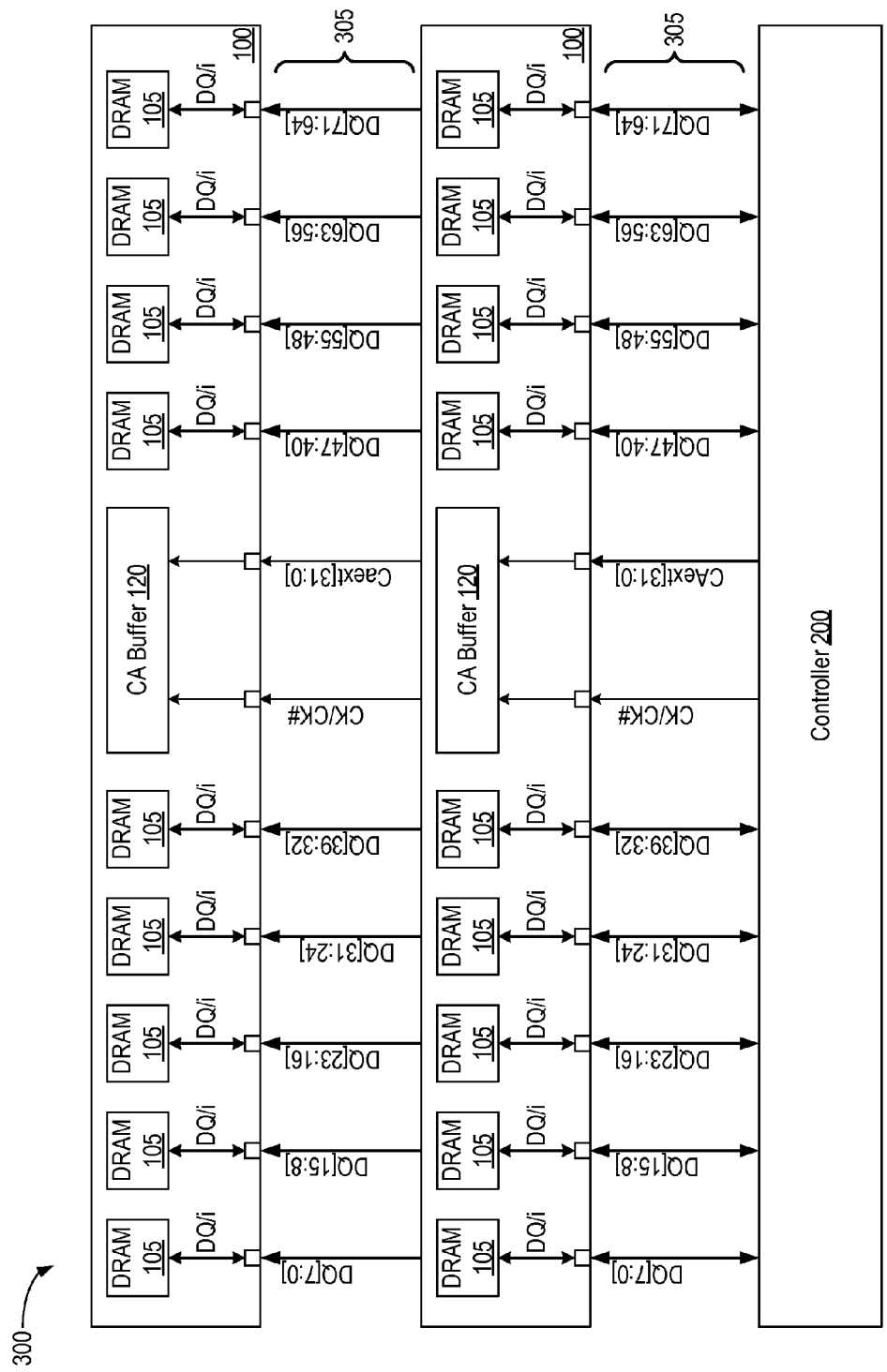
FIG. 3 depicts a memory system 300 in which two modules 100, of the type detailed above in connection with FIGS. 1 and 2, are coupled to memory controller 200 via a common, multi-drop memory bus 305.

FIG. 3 depicts a memory system 300 in which two modules 100, of the type detailed above in connection with FIGS. 1 and 2, are coupled to memory controller 200 via a common, multi-drop memory bus 305. DQ buffers 125 and other details are omitted for ease of illustration, and internal and external data lines DQi and DQ are conflated into paths marked DQ/i. Memory controller 200 uses address information to arbitrate between the two modules 100. Multi-drop buses of this type are well known, and facilitate easy memory extensibility. However, each module creates impedance discontinuities that tend to degrade signaling speed, and thus memory latency and bandwidth. The buffering of data and control signals ameliorates this problem.

Figure 4:
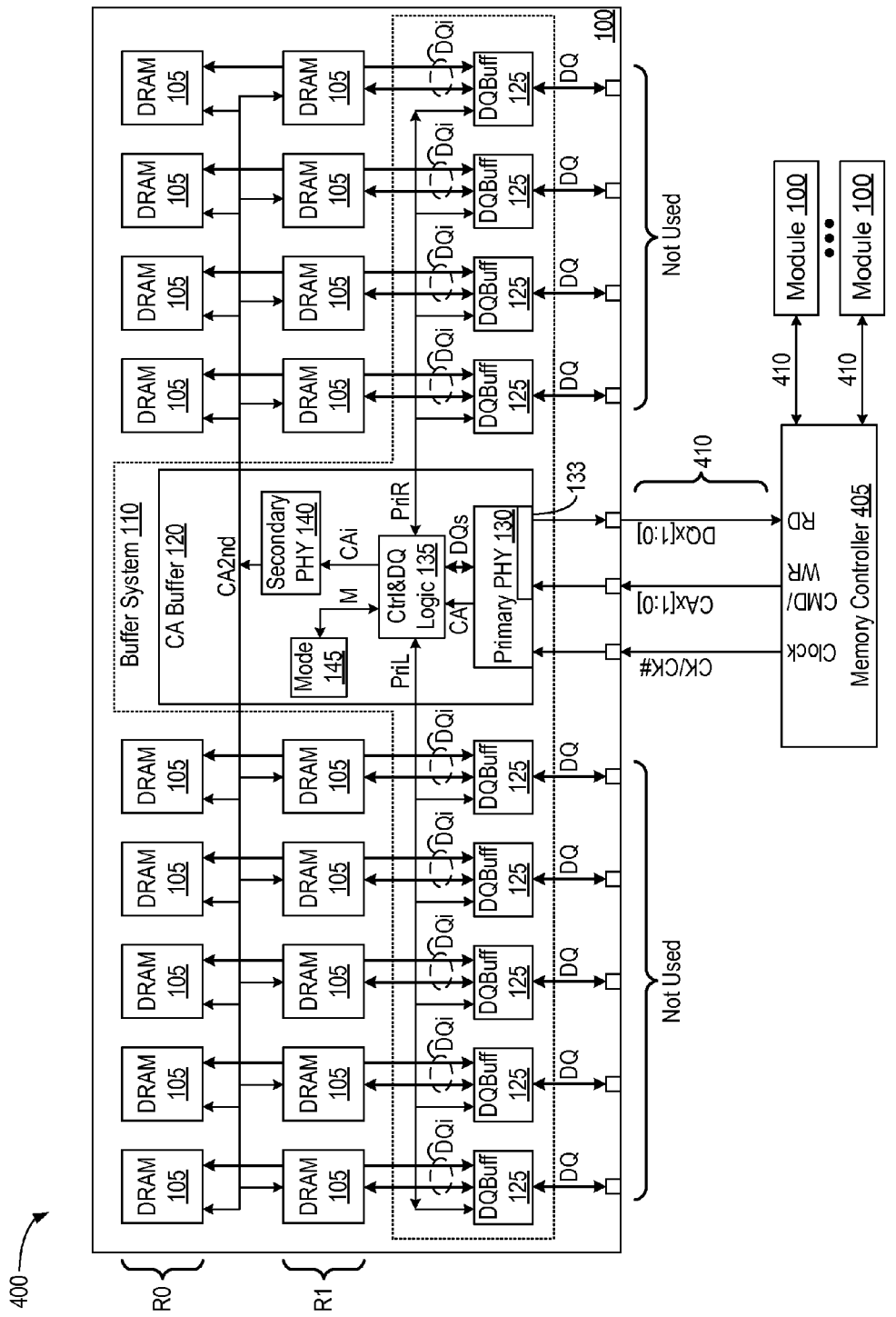
FIG. 4 depicts a memory system 400 in accordance with an embodiment in which memory module 100, introduced in FIG. 1, is programmed to operate in a mode that communicates data and command signals with a memory controller 405 over a serial bus 410 that is much narrower than bus 205 of FIG. 2.

FIG. 4 depicts a memory system 400 in accordance with an embodiment in which memory module 100, introduced in FIG. 1, is programmed to operate in a mode that communicates data and command signals with a memory controller 405 over a serial bus 410 that is much narrower than bus 205 of FIG. 2. Module 100 of FIG. 4 suffers longer latency than does the embodiment of FIG. 2, but advantageously requires far fewer pins and connections. There is a practical limit to the number of I/O pins on a given memory controller, so the reduced width of bus 410 allows for more memory modules, and consequently more storage, per memory controller. From a system perspective, the need for fewer or less complex controllers can significantly reduce the cost per unit of storage. Moreover, where the narrow mode is used to increase the number of modules in a given system, the resultant higher capacity can considerably curb accesses to secondary memory, and thus reduce access latency from a system perspective. For example, systems that incorporate narrow modules of this type can be optimized for use with main-memory databases or memory appliances to provide relatively faster and more predictable performance than similar systems that rely more heavily on disk-based storage.

Memory controller 405 can be a standard microprocessor, a custom integrated circuit, but is in one embodiment a field-programmable gate array (FPGA) programmed as needed to implement memory-control functionality. Serial bus 410 includes differential clock lines CK/CK#, as in prior embodiments, but the external command and address lines are configured differently. In this example, configurable command port 133 is narrowed to just eight lines, four for a pair of differential serial command/address signals CAx[1:0] and four for a pair of data lines DQx[1:0]. Paths CAx[1:0] are unidirectional, and can carry memory commands, addresses, and write data WR to CA buffer 120. Paths DQx[1:0] are also unidirectional, and carry read data RD and status or control information from CA buffer 120 to controller 405. DQ buffers 125 are configured to communicate read and write data via private busses PriL and PriR; the seventy-two single-ended signals that convey external DQ signals, and the nine associated pairs that convey DQS signals, are not used in this mode. The number of connections used to convey commands is also reduced considerably in comparison with the low-latency mode of FIGS. 2 and 3.

The functional changes required of module 100 to go from the wide mode of FIG. 2 to the narrow mode of FIG. 4 are initiated by loading mode register 145 with a value indicative of the narrow mode. Register 145 shares a mode signal M with control and data logic 135 and primary interface 130. Logic 135 conveys other mode information to each DQ buffer 125 to configure those buffers to communicate data via private busses PriL and PriR in lieu of the external DQ connections.

Memory controller 405 delivers write data, commands, and addresses to command port 133 via lines CAx[1:0], and receives read data via lines DQx[1:0]. The widths of these connections can be different in other embodiments. In this embodiment, for example, two of the pins on the CA buffer are modally repurposed to support the serialized CAx[1:0] interface, which carries command/control/address information from the memory controller. These commands are deserialized by configurable command port 133, and logic 135 directs the resultant commands to DRAM devices 105 via secondary command interface CA2nd using normal DDR4 protocols. When device 105 respond the commands (e.g., a read transaction), their data transmissions are conveyed over internal data bus DQi and captured by DQ buffers 125, which interface with CA buffer 120 via private busses PriL and PriR. CA buffer 120 aggregates the read data from buffers 125 and delivers the resultant read data to the memory controller via the DQx interface. In this example, the DQx interface includes two modally redefined pins. Write transactions are handled similarly, in reverse.

Both paths CAx[1:0] and DQx[1:0] can be electrically and logically incompatible with the communication protocols required by DRAM devices 105 because DQ buffers 125 facilitate communication with DRAM devices 105. In this way, a DDR4 module which is fully compatible to the load-reduced DDR4 standard can support a mode that requires only a six-wire interface (two pins for a clock reference, two for command/address, and two for data) on the memory controller, rather than a one hundred forty-wire interface. For the same processor pin-budget and cost-budget, therefore, more than 20× as many memory modules can be serviced. The tradeoff for this serialization mode is access latency. In one embodiment, for example, module 100 provides about 50 ns of access latency in the wide mode of FIG. 2 and about 200 ns of access latency in the narrow mode.

In addition to increasing latency, serializing the data can slow read and write speeds. However, controller 405 can simultaneously access additional modules 100 to make up for such loses in memory bandwidth. In examples in which the memory bandwidth of serial busses 410 are considerably lower than those of the parallel mode, the relative paucity of per-module data traffic in the narrow mode allows module 100 additional time for e.g. error checking. Bus 410 can be implemented using point-to-point connections for improved speed performance.

In some embodiments buffer system 110 can support one or more low-power modes in which some number of modules, or DRAM devices on one or more modules, are disabled. Even empty DRAM consumes power, largely to refresh the contents of empty storage locations. Controller 405 can communicate with buffer 120 on each module to manage power settings, including the number of active DRAM devices 105, DQ buffers 125, or both. Unused modules 100 can thus be kept offline, or at least in a low-power mode, until their storage resources are needed. Controller 405 can be given full control over memory mapping to facilitate this and other functionality.

Figure 5:
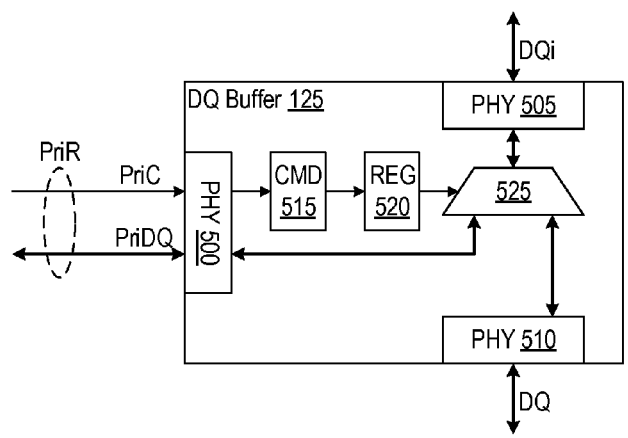
FIG. 5 provides an example of one of configurable DQ buffers 125 of FIG. 1.

FIG. 5 provides an example of one of configurable DQ buffers 125 of FIG. 1. Buffer 125 includes a three interfaces 500, 505, and 510, a command decoder 515, a register 520, and a multiplexer/demultiplexer 525. Private bus PriR includes a command interface PriC to issue instructions to buffer 125 and a bidirectional data interface PriDQ.

At start up, CA buffer 120 (FIG. 1) issues commands to decoder 515 to load register 520 with a value indicative of the desired operational mode. In the wide mode, detailed above in connection with FIG. 2, register 520 controls multiplexer/demultiplexer 525 to interconnect interfaces 505 and 510 so that external data signals DQ are communicated as internal data signals DQi. Data interface PriDQ is not used. In the narrow mode, detailed above in connection with FIG. 4, register 520 controls multiplexer/demultiplexer 525 to route internal data signals DQi via interface PriDQ. External data connection DQ is not used in this example.

Figure 6:
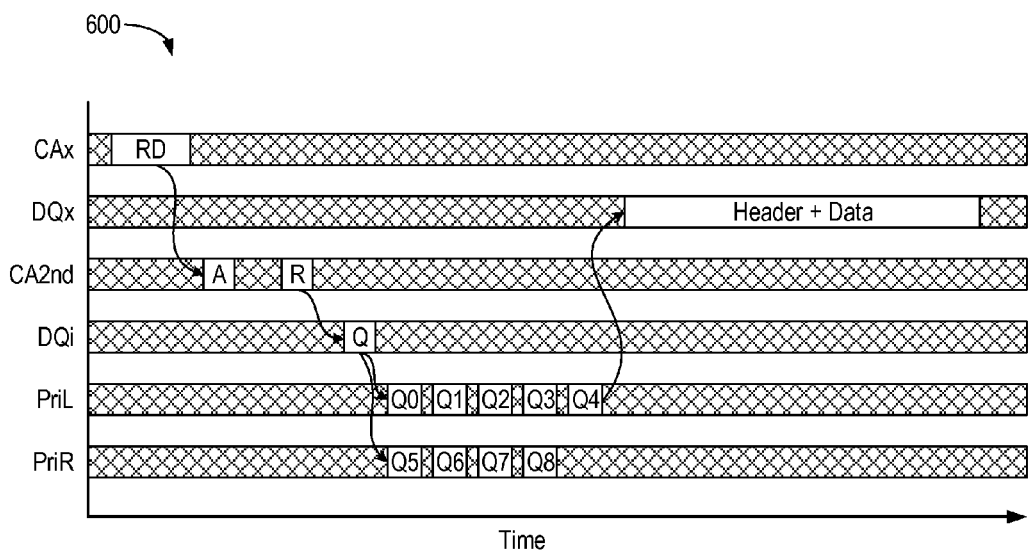
FIG. 6 is a waveform diagram 600 illustrating how module 100 performs a read operation in the narrow configuration of FIG. 4.

FIG. 6 is a waveform diagram 600 illustrating how module 100 performs a read operation in the narrow configuration of FIG. 4. First, module 100 receives an exemplary 64-bit read command RD on interface CAx. Primary interface 130 converts this serial command to parallel, and issues the command to control and data logic 135, which issues successive activate (A) and read (R) commands to devices 105 on secondary command bus CA2nd. Devices 105 respond by delivering a 288-bit read burst Q across the 72 data lines of internal data bus DQi (assuming each device 105 has a burst-length of 4). Each of the nine DQ buffers 125 convey their respective 32-bits of read data over one of private busses PriL and PriR. In this embodiment, each 32-bit parcel is delivered as an eight-bit burst over four data lines of the respective private bus. Control and data logic 135 aggregates the nine 32-bit data parcels before delivering 288 bits of read data and an optional header (e.g., a header might be prepended that includes the 64-bit address associated with the data burst, to simplify transactional ordering within the memory controller; alternatively or additionally, CRC information about the address and/or data burst could be included in a header, to help fortify reliability of the data delivery; other status-related signals could also be included within predefined header fields) to primary interface 130, which serializes the header and data before transmitting them to the memory controller.

Where the read data includes error-correction bits, control and data logic 135 can perform error correction on the module, or can simply deliver the error-correction and data bits to the memory controller. Likewise, error-correction bits can be derived either on or off module 100. If error detection and correction is performed on the module, a summary of those operations could be included within the optional header fields.

Figure 7:
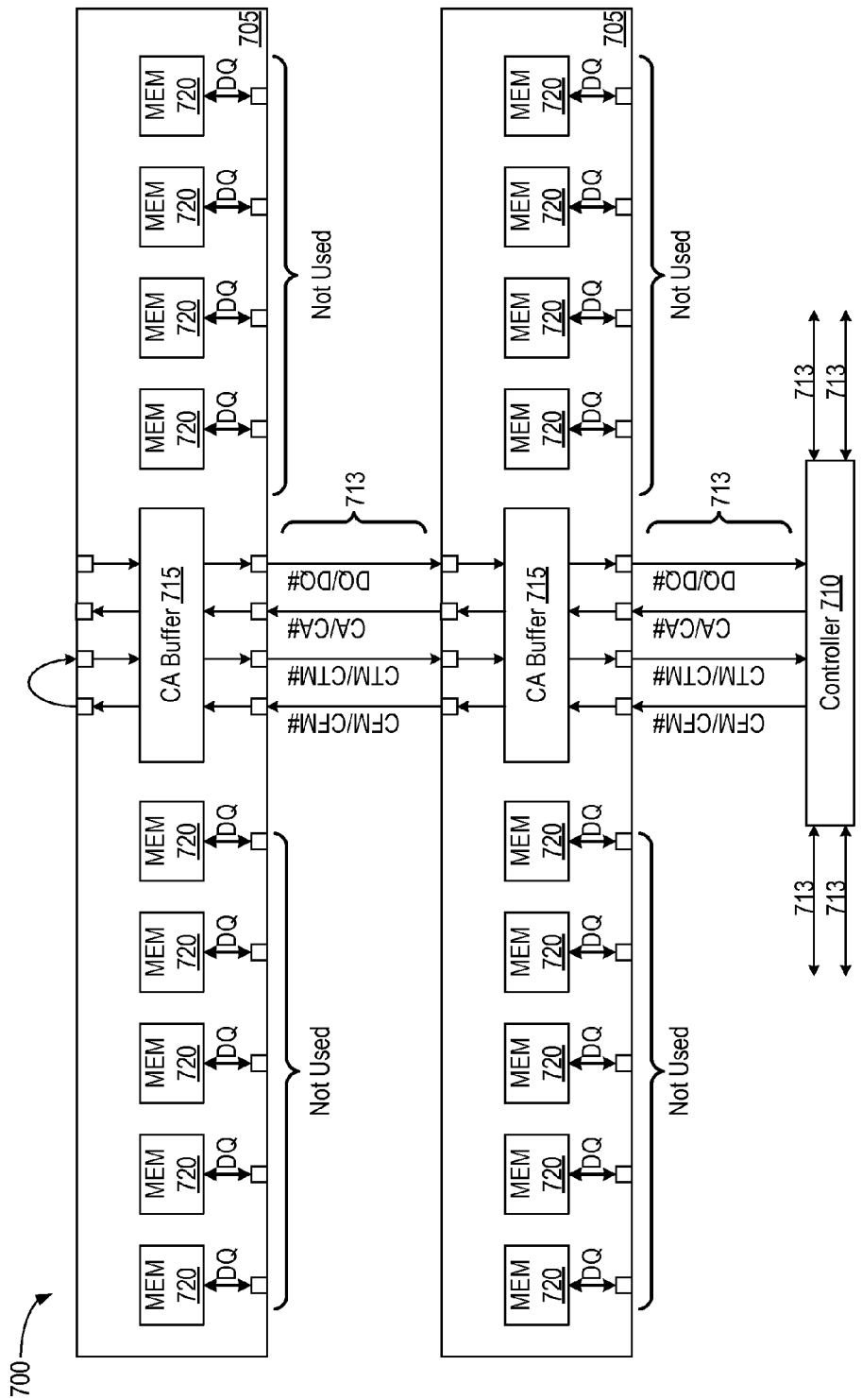
FIG. 7 depicts a memory system 700 in accordance with an embodiment in which two (or more) modules 705 are coupled to a memory controller 710 via a bus 713 in a daisy-chain configuration.

FIG. 7 depicts a memory system 700 in accordance with an embodiment in which two (or more) modules 705 are coupled to a memory controller 710 via a bus 713 in a daisy-chain configuration. In this context, a "daisy chain" is a wiring scheme in which multiple modules are wired together in sequence. In this configuration, controller 710 interfaces with the first module, which in turn interfaces to the second, which in turn interfaces to the third, etc., all using a relatively narrow (e.g., 12-wire) interface for commands, addresses, timing references, and data. As compared with the embodiment of FIG. 4, this connectivity reduces controller pin requirements even further.

Each module 705 includes a CA buffer 715 and nine memories 720. CA buffer 715 is like CA buffer 120 of FIG. 1, but additionally includes support for daisy-chain connectivity to CA buffers on the next module. DQ buffers and various command and data paths are included in modules 705, but are omitted from this illustration for simplicity. Memory controller 710 can schedule many commands to the chain of two or more modules 705 so that the modules 705 can work simultaneously. If desired, the relatively narrow bus width allows controller 710 to have a relatively low pin count or support additional channels and modules. For example, one twelve-wire channel 713 can serve eight or more modules 705.

With reference to the memory channel 713, lines CFM/CFM# convey a unidirectional clock reference that starts at controller 710 ("Clock from master"), flies-by all of modules 705, and turns around at the far end of the channel to become signal CTM/CTM# ("Clock to master"). Signals CA/CA# are source-synchronous, differential command and addresses that are connected point-to-point and repeated to downstream modules. Data signals DQ/DQ# are similarly differential and conveyed and repeated using point-to-point connections.

System 700 simplifies read/write transactions: transmissions from the memory controller to the modules (e.g., commands and write data) are edge-aligned to signal CFM/CFM# on the like-named signal path, while transmissions from the modules to the controller (e.g., read data) are edge-aligned to signal CTM/CTM#. In this topology, transactions (e.g., read, writes, refresh) can be ongoing in each module independently, and transaction data can be collected in round-robin fashion.

Figure 8:
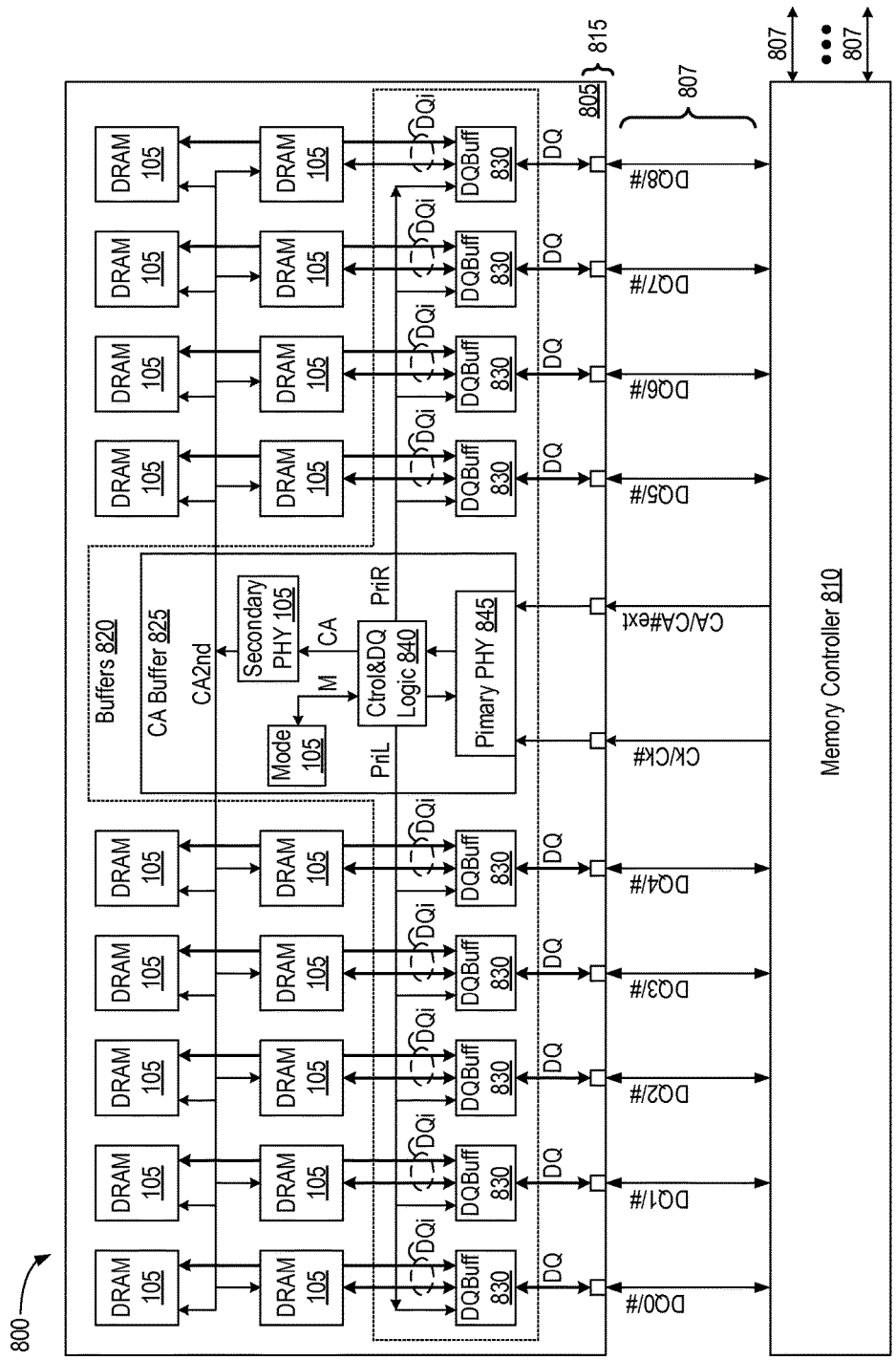
FIG. 8 depicts a memory system 800 in accordance with another embodiment.

FIG. 8 depicts a memory system 800 in accordance with another embodiment. As in the example of FIGS. 1-7, memory system 800 includes a module 805 that supports a wide, low-latency mode and a relatively narrow, higher-latency mode. Rather than route the data through repurposed command lines, however, the embodiment of FIG. 8 employs an external memory bus 807 with a small subset of data lines DQ (e.g., 1 serial connection instead of eight parallel connections for each DQ buffer) in the narrow mode.

System 800 includes module 805 and a memory controller 810. In the wide, low-latency mode, module 805 is configured to operate as described previously in connection with FIG. 2. The following discussion details how module 805 is configured to operate in a narrow mode.

Memory controller 810 can be a standard microprocessor, a custom integrated circuit, but is in one embodiment an FPGA programmed as needed to implement memory-control functionality. Signal pair CK/CK# is a unidirectional clock reference, and signal pair CA/CA# represents a unidirectional, narrow (2-8 wires) command and address bus. Each of nine data connections DQ0/# to DQ8/# is bidirectional, narrow (e.g. 2 wires) and carries both read and write data to and from controller 810.

Module 805 includes components in common with module 100 of FIG. 1, with like-labeled elements being the same or similar. Module 805 additionally includes a system of buffers 820 that manage communication between memory devices 105 and memory controller 810 via a module connector 815 that runs along the bottom of module 805 in this illustration.

The system of buffers 820 includes a CA buffer 825 and nine DQ buffers 830. Each DQ buffer is an 8-bit bidirectional data buffer that supports complementary strobe (DQS/DQS#) signals. A 8-bit external bus DQ connects each buffer 830 to the module connector, and the internal 8-bit DRAM interfaces connects to x8 DRAM devices 105 via internal bus DQi. Each buffer 830 additionally supports a configurable DQ interface that can deliver x8 or x1 data, in dependence upon a mode-selection value delivered over either a left private bus PriL or a right private bus PriR.

In the narrow, relatively high-latency mode, control and DQ logic 840 within CA buffer 825, responsive to a mode value loaded in mode register 105, configured primary interface 845 to reduce the command and address bus width to a single point-to-point serial interface CA/CA#ext in this example. Logic 840 also conveys the mode value to DQ buffers 830 via their respective private busses PriL and PriR to configure each of buffers 830 to support a bidirectional, point-to-point serial interface for data, reducing the requisite number of data pins from eight to two, for example. The remaining DQ pins on module 805 are not used in this mode. Module 805 can additionally support the mode of FIG. 4 in other embodiments.

Figure 9:
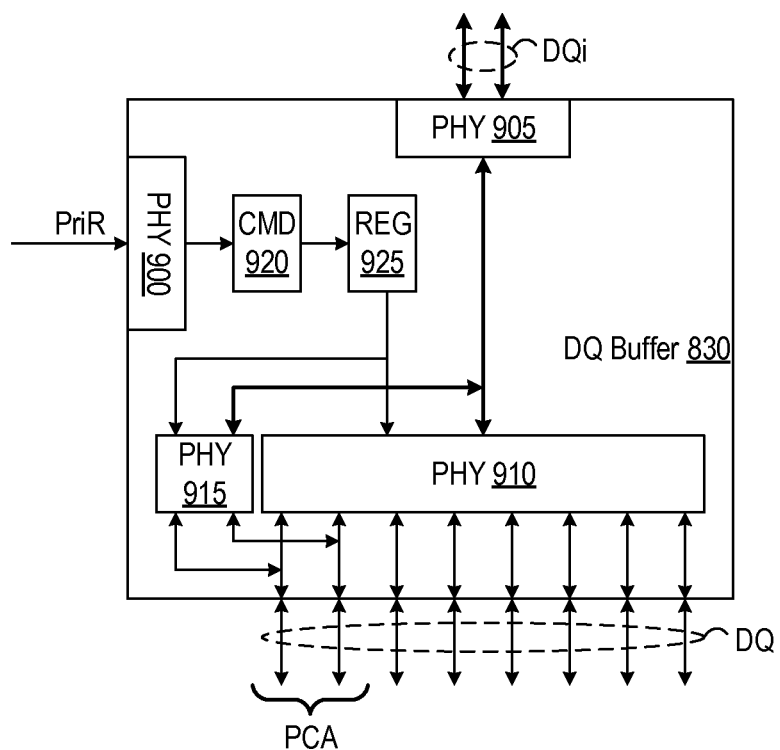
FIG. 9 provides an example of one of configurable DQ buffers 830 of FIG. 8.

FIG. 9 provides an example of one of configurable DQ buffers 830 of FIG. 8. Buffer 830 includes four interfaces 900, 905, 910, and 915; a command decoder 920; and a register 925. At start up, CA buffer 825 (FIG. 8) issues commands to decoder 920 to load register 925 with a value indicative of the desired operational mode. In the wide mode, similar to that detailed above in connection with FIG. 2, register 925 enables interface 910 and disables interface 915 so that eight external data signals DQ are communicated as eight internal data signals DQi. In the narrow mode, register 925 controls enables serial interface 915 and disables interface 910. Interface 915 serializes read data and deserializes write data, communicating data signals over a pair of lines as differential serial signals.

Figure 10:
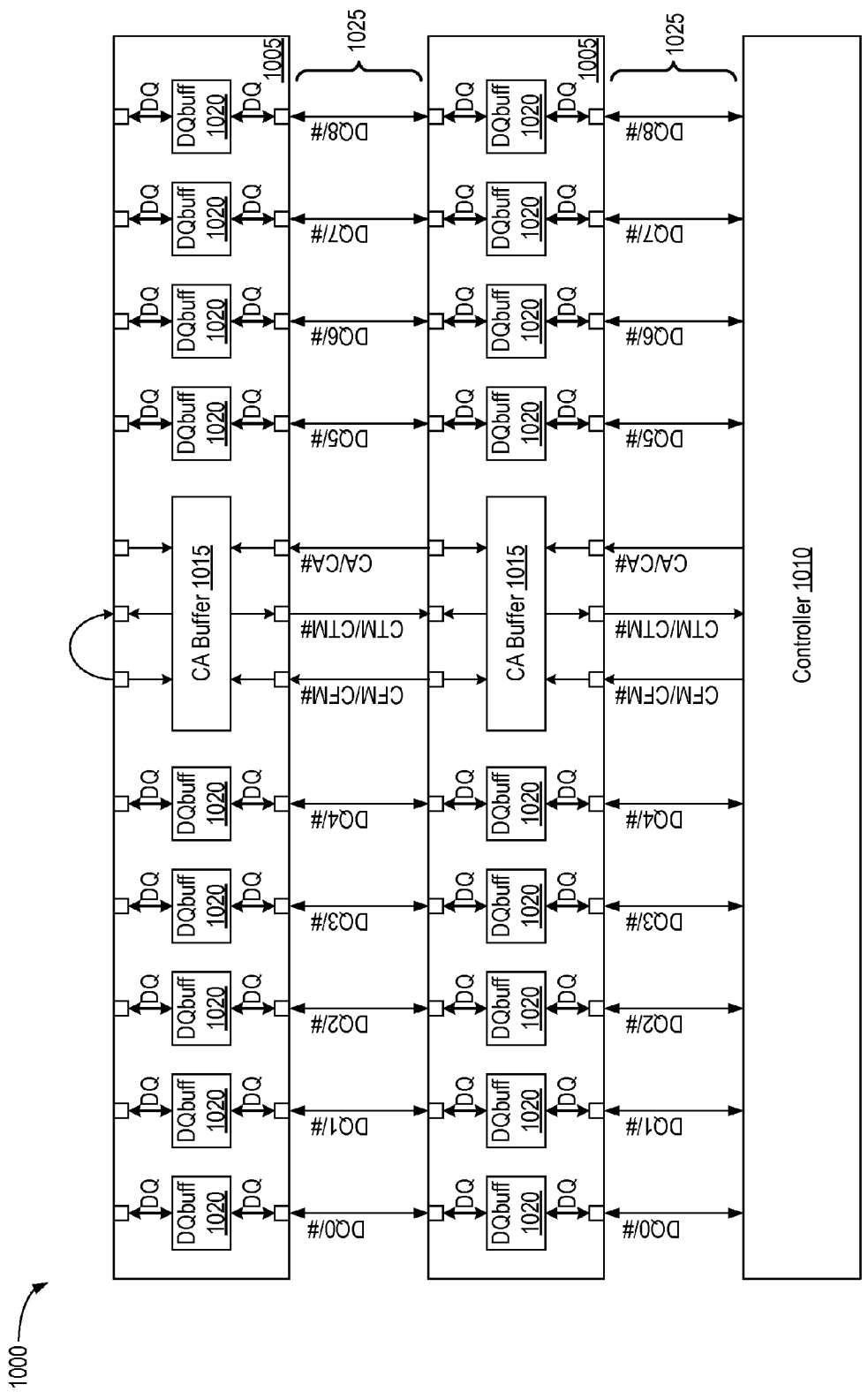
FIG. 10 depicts a memory system 1000 in accordance with an embodiment in which two (or more) modules 1005 are coupled to a memory controller 1010 in a daisy-chain configuration.

FIG. 10 depicts a memory system 1000 in accordance with an embodiment in which two (or more) modules 1005 are coupled to a memory controller 1010 in a daisy-chain configuration. Controller 1010 interfaces with the first module, which in turn interfaces to the second, which in turn interfaces to the third, etc., all using relatively narrow interfaces for commands, addresses, timing references, and data.

Each module 100 includes a CA buffer 1015 and nine DQ buffers 1020. CA buffer 1015 is like CA buffer 120 of FIG. 1, but additionally includes support for daisy-chain connectivity to buffer signals to the next module. Memory devices and various command and data paths are included in modules 1005, but are omitted from this illustration for simplicity.

With reference to the memory channel 1025, lines CFM/CFM# ("clock from master") convey a unidirectional clock reference that starts at controller 1010, flies-by all of modules 1005, and turns around at the far end of the channel to become signal CTM/CTM# ("clock to master"). Signals CA/CA# are source-synchronous, differential commands and addresses that are connected point-to-point and repeated to downstream modules. Data signals DQ0/# through DQ8/# are similarly differential and conveyed and repeated using point-to-point connections.

Figure 11:
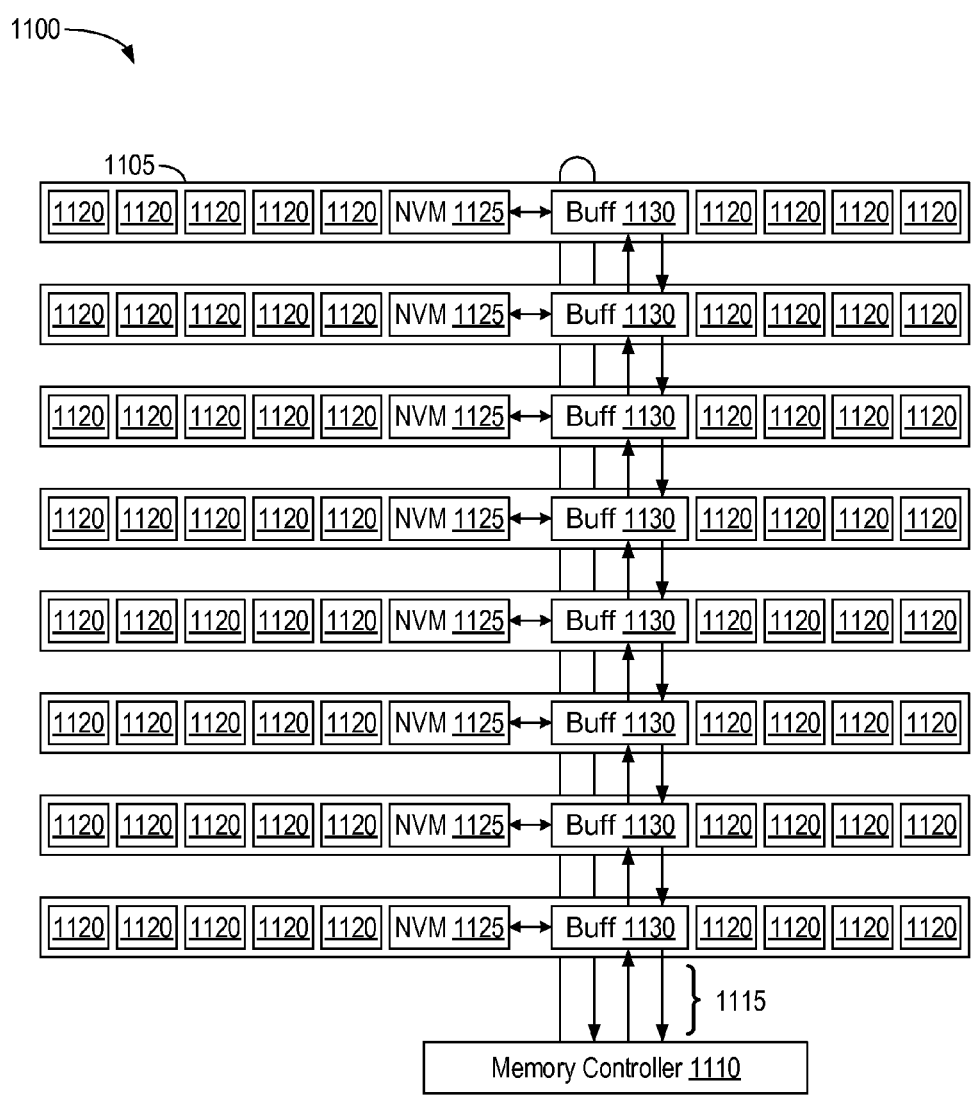
FIG. 11 depicts a memory system 1100 in accordance with an embodiment in which each of 8 memory modules 1105, connected to a memory controller 1110 via a channel 1115, includes both volatile memory devices 1120 and non-volatile memory devices 1125.

FIG. 11 depicts a memory system 1100 in accordance with an embodiment in which each of 8 memory modules 1105, connected to a memory controller 1110 via a channel 1115, includes both volatile memory devices 1120 and non-volatile memory devices 1125. Each module 1105 is a Non-Volatile Dual In-line Memory Module (NVDIMM) that that retains data absent electrical power. Such persistent storage can be important for a number of reasons. For example, sophisticated processes may require considerable computing time and resources to generate data, which would have to be reacquired following an intentional or unintentional system shutdown or failure. Even if the lost data were stored elsewhere, such as on a hard disk or in cloud storage, the time required to repopulate modules 1105 might be excessive. Assuming, for example, that each of the eight modules 1105 stores 16 GB, simply reloading the overall storage space of up to 128 GB of storage space could take an impractical or undesirable time period. Each buffer 1130 can therefore store important information in respective NVM device 1125. In an embodiment in which each module 1105 includes 16 GB of DRAM, a NVM 1125 of 24 GB can store all the data in volatile memory and use the remaining 8 GB for e.g. wear leveling.

Each CA buffer 1130 is connected to respective NVM device 1125 via a high-speed connection, a serial connection such as PCI Express (PCIe) in one example. Controller 1110, at the direction of an underlying process, can raise a persistence flag that causes buffer 1130 to store associated information in both volatile DRAM device 1120 and NVM 1125. In examples in which the memory bandwidth of serial busses 410 are considerably lower than those of the parallel mode, the relative paucity of per-module data traffic in the narrow mode allows module 100 additional time for interacting with NVM 1125.

As discussed above in connection with FIG. 4, some embodiments can place unused modules in a low-power state when not in use. Modules 1105 can support the same or similar low-power modes, but can maintain state absent power. Modules 1105 can also support a mid-power mode in which DRAM devices 1120 are powered off without depriving access to NVM 1125. System 1100 can thus provide low-power read access for data that is rarely written. Buffer 1130 can move data from NVM 1125 to DRAM device 1120 when performance requirements change.

An output of a process for designing an integrated circuit, or a portion of an integrated circuit, comprising one or more of the circuits described herein may be a computer-readable medium such as, for example, a magnetic tape or an optical or magnetic disk. The computer-readable medium may be encoded with data structures or other information describing circuitry that may be physically instantiated as an integrated circuit or portion of an integrated circuit. Although various formats may be used for such encoding, these data structures are commonly written in Caltech Intermediate Format (CIF), Calma GDS II Stream Format (GDSII), or Electronic Design Interchange Format (EDIF). Those of skill in the art of integrated circuit design can develop such data structures from schematic diagrams of the type detailed above and the corresponding descriptions and encode the data structures on computer readable medium. Those of skill in the art of integrated circuit fabrication can use such encoded data to fabricate integrated circuits comprising one or more of the circuits described herein.

While the present invention has been described in connection with specific embodiments, variations of these embodiments will be obvious to those of ordinary skill in the art. Moreover, some components are shown directly connected to one another while others are shown connected via intermediate components. In each instance the method of interconnection, or "coupling," establishes some desired electrical communication between two or more circuit nodes, or terminals. Such coupling may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. §112.

What is claimed is:

1. A memory module supporting a wide-data mode and a narrow-data mode, the memory module comprising:
    a module connector;
    integrated-circuit (IC) memory devices; and
    at least one memory-buffer IC having:
        an internal data interface coupled to the memory ICs;
        an internal command interface coupled to the memory ICs;
        an external data interface coupled to the module connector, the external data interface including a configurable data port supporting:
            a first data connection of a first data width to convey data in the wide-data mode; and
            a second data connection of a second data width, less than the first data width, in the narrow-data mode; and
        an external command interface coupled to the module connector, the external command interface including a configurable command port supporting:
            a first command connection of a first command width to convey memory commands in the wide-data mode; and
            a second command connection of a second command width, less than the first command width, to convey the memory commands in the narrow-data mode.

2. The memory module of claim 1, wherein the second command connection includes a third data connection to convey data in the narrow-data mode.

3. The memory module of claim 2, wherein the data comprises write data.

4. The memory module of claim 2, wherein the second data width is zero.

5. The memory module of claim 1, wherein the second data connection conveys data in the narrow-data mode.

6. The memory module of claim 1, the at least one memory-buffer IC further having a mode-memory register to receive a mode-memory signal indicative of one of the wide-data mode or the narrow-data mode.

7. The memory module of claim 1, wherein the command port conveys single-ended commands in the wide-data mode and differential commands in the narrow-data mode.

8. The memory module of claim 7, wherein the command port conveys differential data in the narrow-data mode.

9. The memory module of claim 8, wherein the command port conveys no data in the wide-data mode.

10. The memory module of claim 1, wherein the at least one buffer includes a command buffer coupled between the internal command interface and the external command interface, and data buffers connected between the internal data interface and the external data interface.

11. The memory module of claim 1, wherein the configurable command port includes connections that can be configured to communicate single-ended or differential signals.

12. The memory module of claim 1, further comprising a second module connector, the at least one memory-buffer IC including a second external command interface coupled to the second module connector to forward external commands to a second module.

13. The memory module of claim 1, wherein the IC memory devices comprise volatile memory for storing the data in the narrow-data mode, the memory module further comprising non-volatile memory coupled to the at least one memory-buffer IC to store the data.

14. The memory module of claim 13, the non-volatile memory storing the data in the wide-data mode.

15. A memory system comprising:
    a command buffer to facilitate communication between a memory controller and dynamic random-access memory (DRAM), the DRAM to store write data and provide read data, the command buffer including:
    a configurable command port for receiving first memory-controller commands in a parallel-access mode, and for receiving second memory-controller commands and at least one of the read data and the write data in a serial-access mode.

16. The memory system of claim 15, further comprising:
    a memory bus coupled to the first-mentioned command buffer and the memory controller; and
    a second command buffer to facilitate communication between the memory controller and second DRAM;
    wherein the second command buffer is connected to the memory controller via the first-mentioned buffer.

17. The memory system of claim 16, wherein the second command buffer is connected to the memory controller via the first-mentioned command buffer in a daisy-chain configuration.

18. The memory system of claim 15, further comprising a data buffer to convey the write data and the read data to and from the DRAM in the parallel-access mode.

19. The memory system of claim 18, the command buffer to direct the write data and the read data through the data buffer in the parallel-access mode.

20. The memory system of claim 15, further comprising non-volatile memory coupled to the command buffer to store the write data.

* * * * *